US009685460B2

(12) United States Patent
Choi et al.

(10) Patent No.: US 9,685,460 B2
(45) Date of Patent: Jun. 20, 2017

(54) ARRAY SUBSTRATE, METHOD FOR MANUFACTURING THE SAME, AND DISPLAY DEVICE

(71) Applicant: BOE TECHNOLOGY GROUP CO., LTD., Beijing (CN)

(72) Inventors: Seungjin Choi, Beijing (CN); Heecheol Kim, Beijing (CN); Youngsuk Song, Beijing (CN); Seongyeol Yoo, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 0 days.

(21) Appl. No.: 14/416,005

(22) PCT Filed: Apr. 22, 2014

(86) PCT No.: PCT/CN2014/075870
§ 371 (c)(1),
(2) Date: Jan. 20, 2015

(87) PCT Pub. No.: WO2015/096314
PCT Pub. Date: Jul. 2, 2015

(65) Prior Publication Data
US 2016/0020227 A1      Jan. 21, 2016

(30) Foreign Application Priority Data

Dec. 26, 2013    (CN) .......................... 2013 1 0732967

(51) Int. Cl.
*H01L 27/12* (2006.01)
*H01L 21/00* (2006.01)
*G02F 1/1362* (2006.01)

(52) U.S. Cl.
CPC ........ *H01L 27/1225* (2013.01); *G02F 1/1362* (2013.01); *H01L 21/00* (2013.01);
(Continued)

(58) Field of Classification Search
None
See application file for complete search history.

(56) References Cited

U.S. PATENT DOCUMENTS 6,989,299 B2    1/2006  Dai et al.
8,519,396 B2 *  8/2013  Lee ..................... H01L 27/1255
                                                                257/52
(Continued)

FOREIGN PATENT DOCUMENTS

CN    101060123 A    10/2007
CN    101281887 A    10/2008
(Continued)

OTHER PUBLICATIONS

Office Action in Chinese Patent Application No. 201310732967.4, dated Oct. 10, 2015.
(Continued)

*Primary Examiner* — Abul Kalam
(74) *Attorney, Agent, or Firm* — Brooks Kushman P.C.

(57) ABSTRACT

The present disclosure provides an array substrate, its manufacturing method and a display device. The method includes forming a source electrode and a drain electrode of a thin film transistor, an active layer and a first transparent electrode in the array substrate by a masking step. The active layer and the first transparent electrode are formed by an identical metal oxide layer, and the source electrode and the drain electrode are arranged above the active layer. The first transparent electrode corresponds to a first semi-transparent region of a mask, a channel region of the thin film transistor corresponds to a second semi-transparent region of the mask, the source electrode and drain electrode of the thin film transistor correspond to a non-transparent region of the
(Continued)

mask, and the first semi-transparent region of the mask is of transmittance greater than that of the second semi-transparent region of the mask.

10 Claims, 11 Drawing Sheets (52) U.S. Cl.
CPC ........ *H01L 27/127* (2013.01); *H01L 27/1288* (2013.01); *G02F 2001/136231* (2013.01)

(56) References Cited

U.S. PATENT DOCUMENTS

| | | | | |
|---|---|---|---|---|
| 9,006,744 | B2* | 4/2015 | Lee | H01L 29/4908 257/59 |
| 2005/0142680 | A1 | 6/2005 | Ha et al. | |
| 2011/0068341 | A1* | 3/2011 | Li | H01L 27/12 257/59 |
| 2011/0297929 | A1* | 12/2011 | Liu | H01L 27/1214 257/43 |
| 2012/0161137 | A1* | 6/2012 | Lee | H01L 27/1255 257/59 |
| 2012/0184060 | A1* | 7/2012 | Song | H01L 27/1214 438/34 |
| 2013/0140574 | A1* | 6/2013 | Liu | H01L 27/1288 257/59 |
| 2013/0302939 | A1* | 11/2013 | Liu | H01L 29/66969 438/104 |
| 2014/0077214 | A1* | 3/2014 | Deng | G02F 1/1368 257/59 |
| 2016/0005870 | A1* | 1/2016 | Huang | H01L 29/786 257/43 |
| 2016/0027818 | A1* | 1/2016 | Yoo | G02F 1/136286 257/43 |

FOREIGN PATENT DOCUMENTS

| | | |
|---|---|---|
| CN | 101494256 A | 7/2009 |
| CN | 101587272 A | 11/2009 |
| CN | 102645799 A | 8/2012 |
| CN | 102646630 A | 8/2012 |
| CN | 102738007 A | 10/2012 |
| CN | 202473925 U | 10/2012 |
| CN | 102944959 A | 2/2013 |
| CN | 103149760 A | 6/2013 |
| CN | 203277383 U | 11/2013 |
| CN | 103456747 A | 12/2013 |
| CN | 103715137 A | 4/2014 |
| JP | H09-127477 A | 5/1997 |

OTHER PUBLICATIONS

International Search Report and Written Opinion in PCT International Application No. PCT/CN2014/075870, dated Sep. 26, 2014.
Office Action in Chinese Patent Application No. 201310732967.4, dated Jun. 3, 2016.
Office Action in Chinese Patent Application No. 201310732967.4, dated Nov. 30, 2016.

* cited by examiner

ARRAY SUBSTRATE, METHOD FOR MANUFACTURING THE SAME, AND DISPLAY DEVICE

CROSS-REFERENCE TO RELATED APPLICATION

This application is the U.S. national phase of PCT Application No. PCT/CN2014/075870 filed on Apr. 22, 2014, which claims a priority of the Chinese patent application No. 201310732967.4 filed on Dec. 26, 2013, which is incorporated herein by reference in its entirety.

TECHNICAL FIELD

The present disclosure relates to the field of display technology, in particular to an array substrate, a method for manufacturing the same and a display device.

BACKGROUND

Liquid crystal display device has been widely used in such devices as TVs, displays, laptop PCs and flat panel PCs due to its advantages such as small volume, low power consumption and low radiation.

Currently, during the manufacture of a high advanced dimension switch (HADS) array substrate, it is usually required to carry out eight masking steps, so as to pattern a gate electrode, a gate insulating layer, an etching stop layer, a source/drain metal layer, a passivation layer, a common electrode, another passivation layer, and a pixel electrode. For each masking step, an expensive mask is required, and it is also required to carry out additional steps as exposing, developing, etching and asking. As a result, the process for manufacturing an existing array substrate is complex and the production cost thereof is high. Hence, there is an urgent need to provide a manufacturing process with few masking steps.

SUMMARY

An object of the present disclosure is to reduce the complexity of an existing process for manufacturing an array substrate.

In one aspect, the present disclosure provides a method for manufacturing an array substrate, including forming a source electrode and a drain electrode of a thin film transistor, an active layer and a first transparent electrode in the array substrate by a masking step, wherein the active layer and the first transparent electrode are formed by an identical metal oxide layer, the source electrode and the drain electrode are arranged above the active layer, the first transparent electrode corresponds to a first semi-transparent region of a mask, a channel region of the thin film transistor corresponds to a second semi-transparent region of the mask, the source electrode and drain electrode of the thin film transistor correspond to a non-transparent region of the mask, and the first semi-transparent region of the mask is of transmittance greater than that of the second semi-transparent region of the mask.

Alternatively, in the masking step, after being exposed by the mask, a region of a photoresist layer corresponding to the first semi-transparent region of the mask is of a thickness less than a thickness of a region of the photoresist layer corresponding to the second semi-transparent region of the mask and a thickness of a region of the photoresist layer corresponding to the non-transparent region of the mask.

Alternatively, the first transparent electrode is formed by the metal oxide through plasma treatment.

Alternatively, the semi-transparent regions of the mask are half-tone or graytone masks.

Alternatively, the metal oxide is IGZO, or ITZO, or a mixture thereof.

Alternatively, prior to forming the source electrode and the drain electrode of the thin film transistor, the active layer and the first transparent electrode in the array substrate by a masking step, the method further comprises: forming a light shielding layer of the active layer and a leading wire of the first transparent electrode on the array substrate, wherein the light shielding layer corresponds to an active layer region of the thin film transistor, and the first transparent electrode is a common electrode.

Alternatively, subsequent to forming the source electrode and the drain electrode of the thin film transistor, the active layer and the first transparent electrode in the array substrate by a masking step, the method further includes: forming an insulating layer covering the source electrode, the drain electrode and the first transparent electrode and provided with a via-hole, and forming a gate electrode of the thin film transistor and a second transparent electrode. The second transparent electrode is a slit pixel electrode and electrically connected to the drain electrode through the via-hole in the insulating layer.

Alternatively, an upper surface of the drain electrode is flush with an upper surface of the insulating layer adjacent to the first transparent electrode.

Alternatively, prior to forming the source electrode and the drain electrode of the thin film transistor, the active layer and the first transparent electrode in the array substrate by a masking step, the method further includes forming the insulating layer and the gate electrode of the thin film transistor.

Alternatively, subsequent to forming the source electrode and the drain electrode of the thin film transistor, the active layer and the first transparent electrode in the array substrate by a masking step, the method further includes forming a conductive contact connecting the drain electrode and the first transparent electrode, the first transparent electrode being a pixel electrode; and forming a passivation layer and the second transparent electrode above the conductive contact, the second transparent electrode being a slit common electrode.

In another aspect, the present disclosure provides an array substrate, including a base substrate; an active layer and a common electrode formed above the base substrate and formed by an identical metal oxide layer; a source electrode and a drain electrode formed above the active layer; an insulating layer formed above the source electrode, the drain electrode and the common electrode and provided with a via-hole; a pixel electrode formed above the insulating layer and connected to the drain electrode through the via-hole in the insulating layer; and a gate electrode formed above the insulating layer.

Alternatively, the common electrode is formed by the metal oxide through plasma treatment.

Alternatively, the array substrate further includes a light shielding layer formed between the base substrate and the active layer, and a common electrode leading wire electrically connected to the common electrode.

In yet another aspect, the present disclosure provides an array substrate, including a base substrate; a gate electrode formed above the base substrate; an insulating layer covering the base substrate and the gate electrode; an active layer and a pixel electrode formed above the insulating layer, formed by an identical metal oxide layer and adjoining with each other; a source electrode and a drain electrode formed above the active layer; a conductive contact formed above the drain electrode and the pixel electrode and configured to enable the drain electrode to be electrically connected to the pixel electrode; a passivation layer covering the insulating layer, the source electrode, the drain electrode, the active layer, the conductive contact and the pixel electrode; and a common electrode formed above the passivation layer.

Alternatively, the pixel electrode is formed by the metal oxide through plasma treatment.

In still yet another aspect, the present disclosure provides a display device including the above-mentioned array substrate.

According to the method for manufacturing the array substrate in the present disclosure, the mask having different transmittance at different positions is used in one masking step, the photoresist layer with different thicknesses corresponding to the transmittance is formed after the exposure, and then the desired devices are formed in the subsequent etching steps, respectively. As a result, it is able to reduce the masking steps, and significantly reduce the steps desired for manufacturing the array substrate, thereby to reduce the production cost thereof.

BRIEF DESCRIPTION OF THE DRAWINGS

The features and advantages of the present disclosure will be more apparent with reference to the drawings. The following drawings are for illustrative purposes only, but shall not be used to limit the present disclosure. In the drawings.

FIGS. 2-23 are schematic views showing the steps of the method for manufacturing the array substrate according to one embodiment of the present disclosure, wherein FIG. 23 is a schematic view showing an array substrate according to one embodiment of the present disclosure;

FIGS. 25-34 are schematic views showing the steps of the method for manufacturing the array substrate according to the other embodiment of the present disclosure, wherein FIG. 34 is a schematic view showing an array substrate according to the other embodiment of the present disclosure.

DETAILED DESCRIPTION

The present disclosure will be described hereinafter in conjunction with the drawings.

Figure 1:
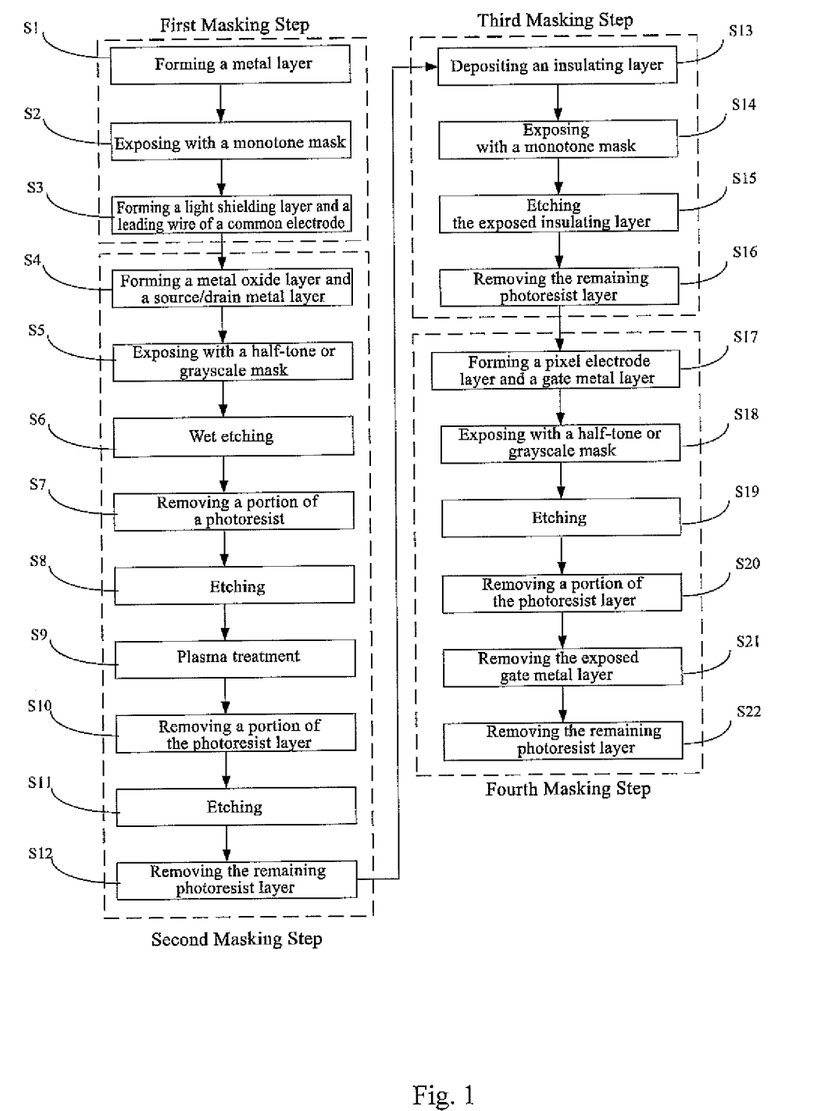
FIG. 1 is a flow chart of a method for manufacturing an array substrate according to one embodiment of the present disclosure.

FIG. 1 is a flow chart of a method for manufacturing an array substrate according to one embodiment of the present disclosure. As shown in FIG. 1, the method of the present disclosure includes four masking steps, and as compared with an existing method for manufacturing an HADS array substrate in which eight masking steps are required, four masking steps are reduced. As a result, it is able to significantly reduce the steps desired for manufacturing the array substrate, thereby to reduce the production cost thereof. The method for manufacturing the array substrate of the present disclosure will be described hereinafter in conjunction with FIGS. 2-17.

Figure 23:
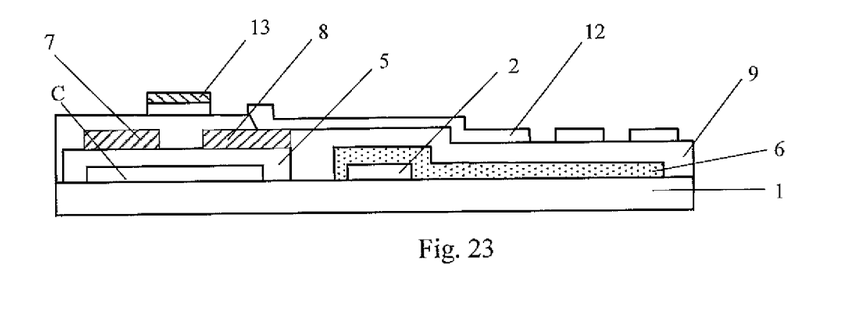

Referring to FIG. 23, which shows the structure of the resultant array substrate, 12 represents a pixel electrode, and 13 represents a gate electrode of a thin film transistor. Here, a left portion of FIG. 23 is called as a region Ft where the thin film transistor is to be formed, and a right portion thereof is called as a region Fp where pixels are to be formed, so as to facilitate the description.

A first masking step includes the following steps.

Figure 2:
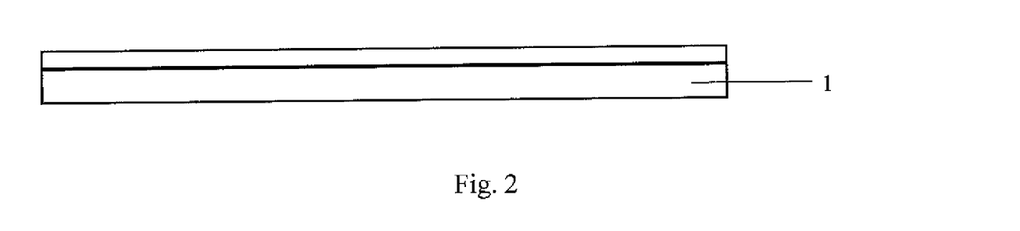

Step S1: depositing a metal layer on a base substrate 1, as shown in FIG. 2.

Figure 3:
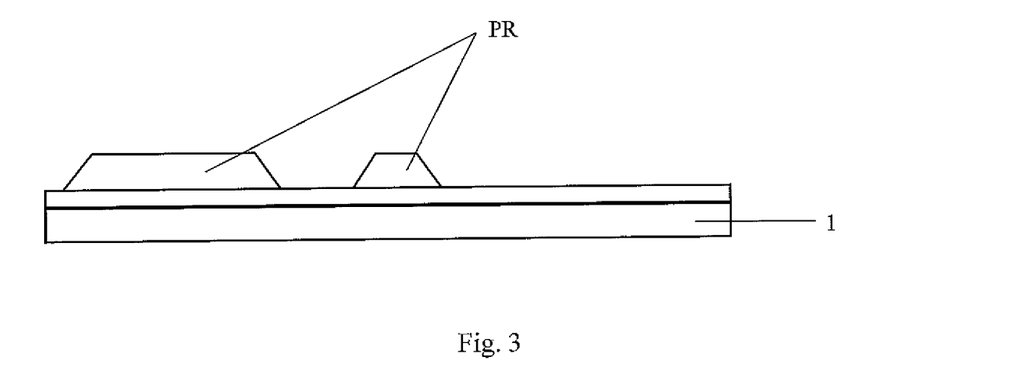

Step S2: applying a first photoresist layer PR, and exposing and developing the first photoresist layer with a monotone mask. FIG. 3 shows the first photoresist layer PR after exposure and development.

Figure 4:
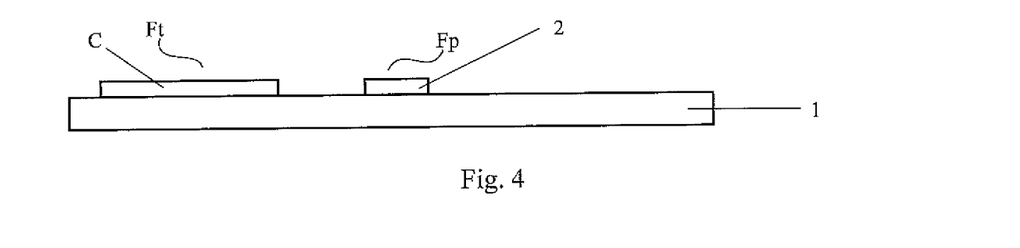

Step S3: etching the metal layer and removing the remaining first photoresist layer, so as to form a light shielding layer C at the region Ft where the thin film transistor is to be formed and form a leading wire 2 of a common electrode at the pixel region Fp, as shown in FIG. 4.

A second masking step includes the following steps.

Figure 5:
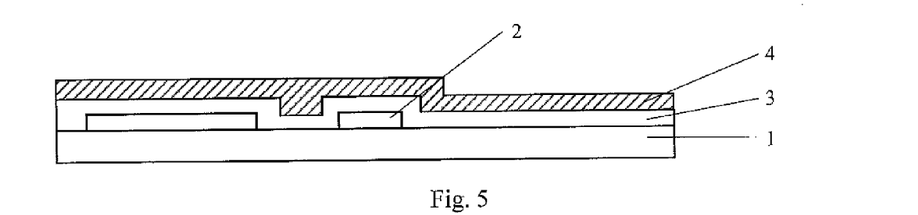

Step S4: depositing a metal oxide layer 3 and a source/drain metal layer 4 on the base substrate 1 sequentially, as shown in FIG. 5. The metal oxide layer 3 may be made of IGZO, ITZO, or any other metal oxide having semiconductor properties. The source/drain metal layer 4 may be made of Cu, Al or Mo.

Figure 6:
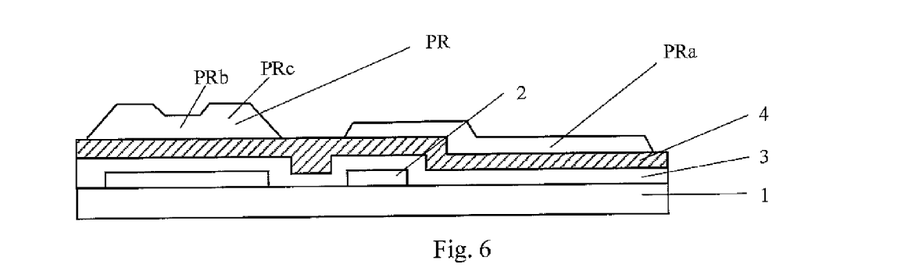

Step S5: applying a second photoresist layer onto the source/drain metal layer 4, and exposing the second photoresist layer with a mask. The to-be-formed common electrode corresponds to a first semi-transparent region PRa of the mask, a channel of the to-be-formed thin film transistor corresponds to a second semi-transparent region PRb of the mask, a source electrode and a drain electrode of the to-be-formed thin film transistor correspond to a non-transparent region PRc of the mask, and the first semi-transparent region of the mask is of transmittance greater than that of the second semi-transparent region. The mask may be a halftone or graytone mask. As is known in the art, the different transmittance of the mask will result in different thicknesses of the photoresist layer after the exposure. FIG. 6 shows the second photoresist layer after the exposure and development with the mask. A region of the second photoresist layer where the common electrode is to be formed is of a first thickness t1, a region where the channel of the thin film transistor is to be formed is of a second thickness t2, and a region where the source electrode and the drain electrode are to be formed is of a third thickness t3. The first thickness is less than the second thickness, and the second thickness is less than the third thickness. Alternatively, a region of a third photoresist layer corresponding to the region PRc of the mask is of a thickness, i.e., the third thickness t3, of 20000 to 30000 Å. After the exposure and development, the first thickness t1 of the region of the first photoresist layer corresponding to the region PRa of the mask is 2000 to 6000 Å, and the second thickness t2 of the region of the second photoresist layer corresponding to the region PRb of the mask is 6000 to 10000 Å.

Figure 7:
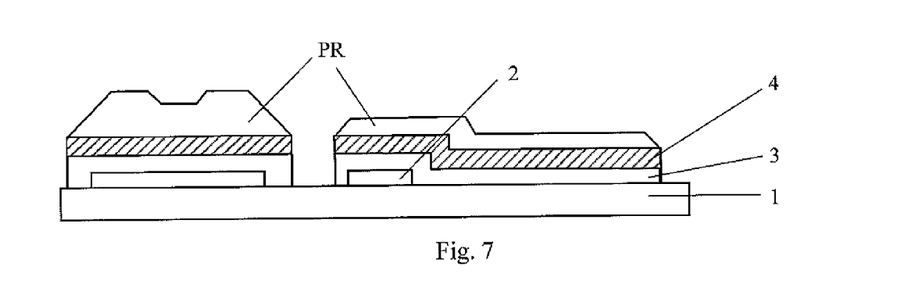

Step S6: etching a region not covered with the second photoresist layer, so as to remove the exposed source/drain metal layer 4 and metal oxide layer 3. Alternatively, a wet etching method may be used. FIG. 7 shows the structure after the etching.

Figure 8:
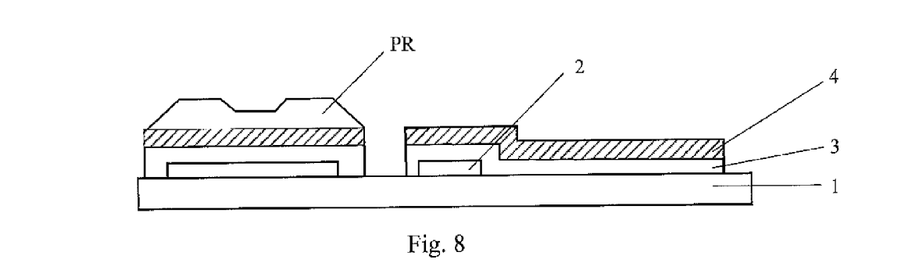

Step S7: removing a portion with a thickness equivalent to the first thickness t1 from the entire second photoresist layer by ashing, etc., so as to expose the region where the common electrode is to be formed (i.e., a right-half portion of the base substrate), as shown in FIG. 8.

Figure 9:
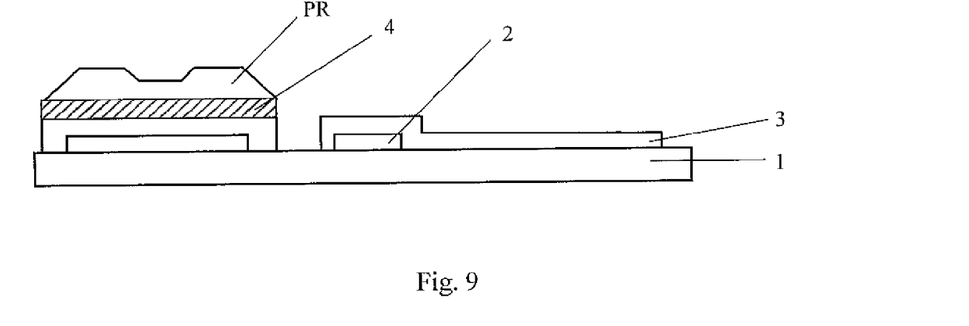

Step S8: removing the exposed source/drain metal layer 4 by etching, so as to expose the metal oxide layer 3 therebelow, as shown in FIG. 9.

Figure 10:
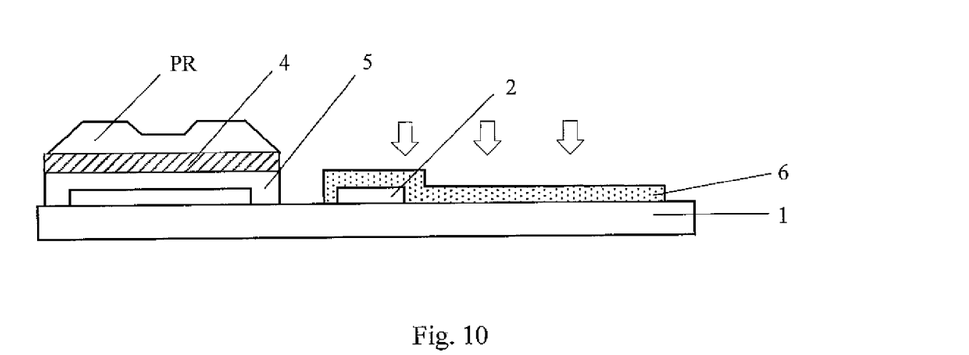

Step S9: subjecting the exposed metal oxide layer 3 to plasma treatment, so as to enable the exposed metal oxide layer 3 to have electrical conducting properties, thereby to form the common electrode 6 with this exposed metal oxide layer. The metal oxide layer not subjected to the plasma treatment still maintains its semiconductor properties and serves as an active layer 5, as shown in FIG. 10.

Figure 11:
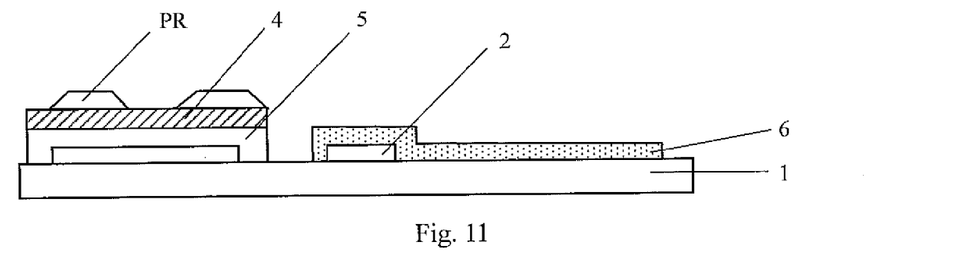

Step S10: removing a portion with a thickness obtained by subtracting the first thickness from the second thickness from the entire second photoresist layer by ashing, etc. After the ashing, the region PRb of the second photoresist layer with the second thickness is fully removed, so as to expose the region where the channel of the thin film transistor is to be formed. FIG. 11 shows the structure after the ashing.

Figure 12:
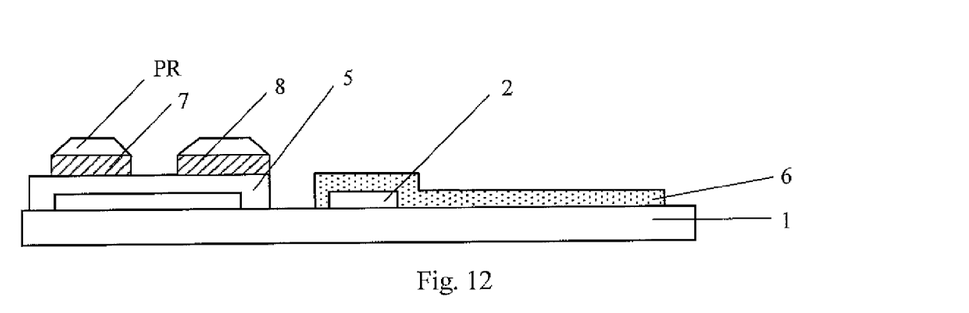

Step S11: etching the exposed source/drain metal layer 4 until the active layer therebelow is reached, so as to form the source electrode 7 and the drain electrode 8 of the thin film transistor, as shown in FIG. 12.

Figure 13:
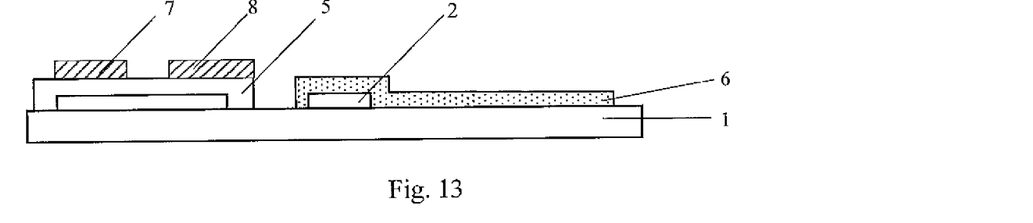

Step S12: removing the remaining second photoresist layer after the etching, as shown in FIG. 13.

A third masking step includes the following steps.

Figure 14:
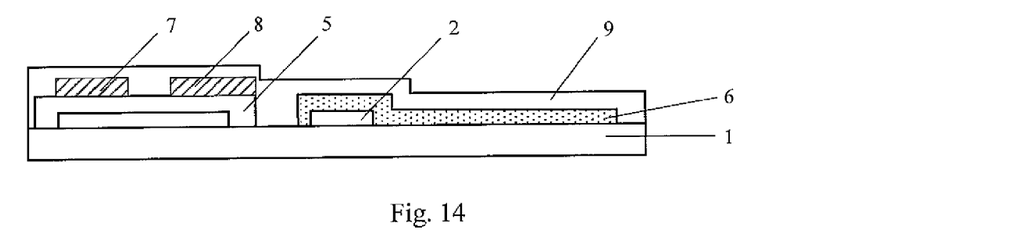

Step S13: depositing an insulating layer 9 on the base substrate 1 so as to cover the entire base substrate 1, as shown in FIG. 14.

Figure 15:
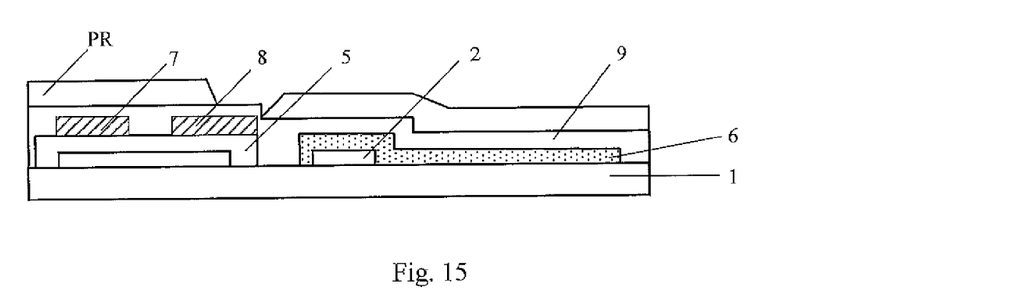

Step S14: applying a third photoresist layer onto the insulating layer 9, and exposing and developing the third photoresist layer with a monotone mask, so as to expose the insulating layer 9 above a region of the drain electrode 8 adjacent to the common electrode 6, as shown in FIG. 15.

Figure 16:
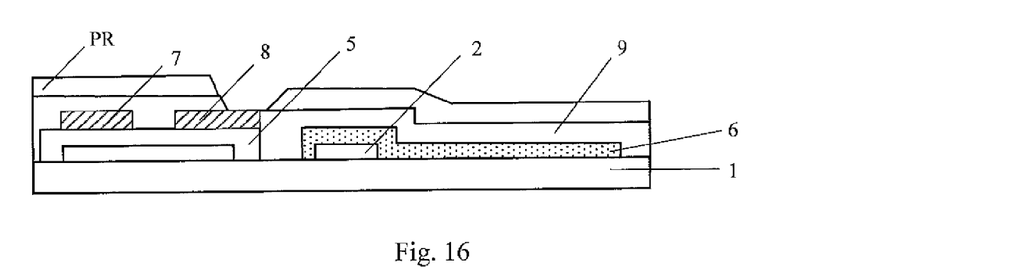

Step S15: etching the exposed insulating layer 9, and forming an opening (via-hole) in the insulating layer 9, so as to expose the region of the drain electrode 8 adjacent to the common electrode 6 and arranged below the insulating layer 9, as shown in FIG. 16. Alternatively, an upper surface of the exposed drain electrode 8 is flush with an upper surface of the insulating layer 9 at the pixel region.

Figure 17:
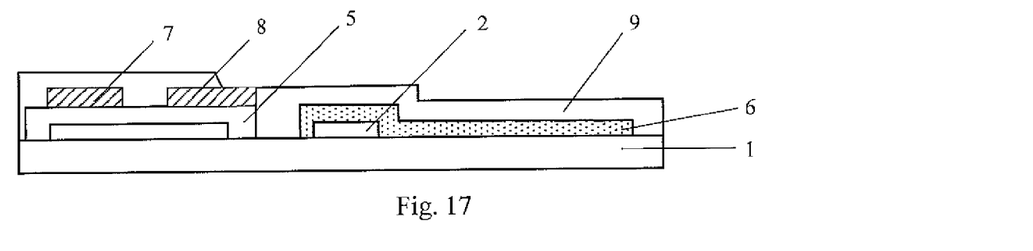

Step S16: removing the remaining third photoresist layer, as shown in FIG. 17.

A fourth masking step includes the following steps.

Figure 18:
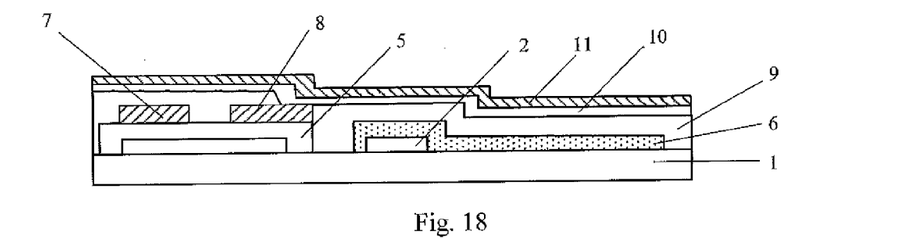

Step S17: depositing a second pixel electrode layer 10 and a gate metal layer 11 on the base substrate 1 sequentially, as shown in FIG. 18.

Figure 19:
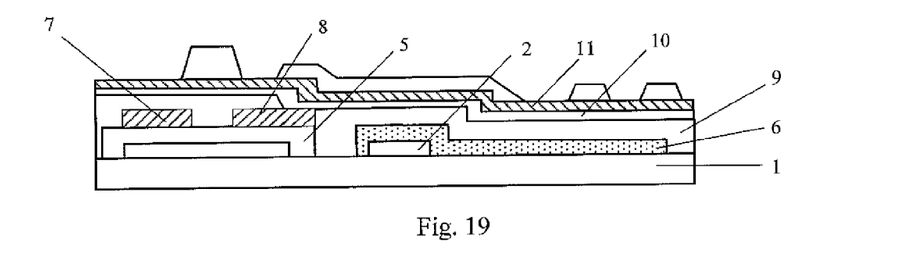

Step S18: applying a fourth photoresist layer onto the gate metal layer 11, and exposing the fourth photoresist layer with another graytone or half-tone mask. FIG. 19 shows the fourth photoresist layer after the exposure and development, in which the region Fp of the fourth photoresist layer where the pixel electrode is to be formed is of a thickness less than that of the region Ft where the gate electrode of the thin film transistor is to be formed.

Figure 20:
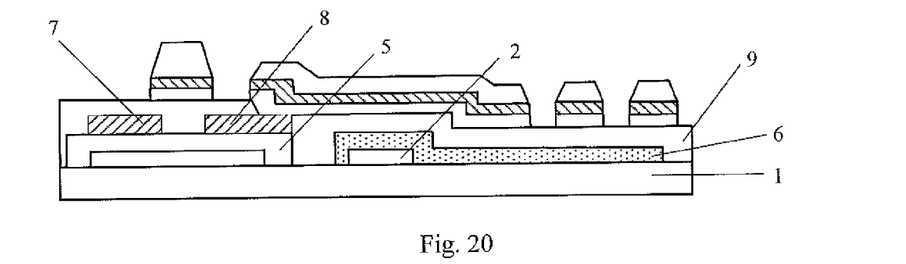

Step S19: etching a region not covered with the fourth photoresist layer, so as to remove the exposed pixel electrode layer 10 and gate metal layer 11, thereby to pattern the slit pixel electrode and the gate electrode, as shown in FIG. 20.

Figure 21:
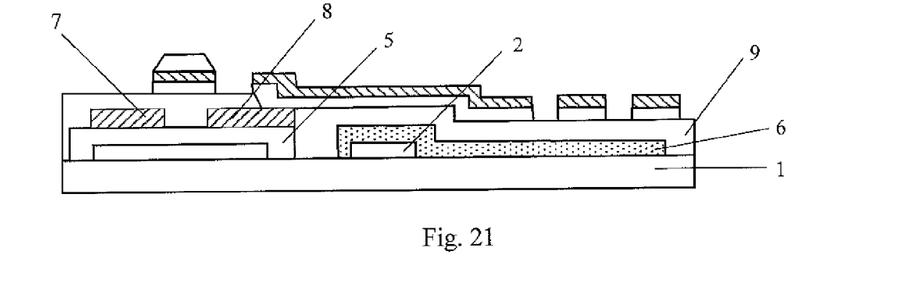

Step S20: exposing the gate metal layer at the pixel electrode region by asking, etc., as shown in FIG. 21.

Figure 22:
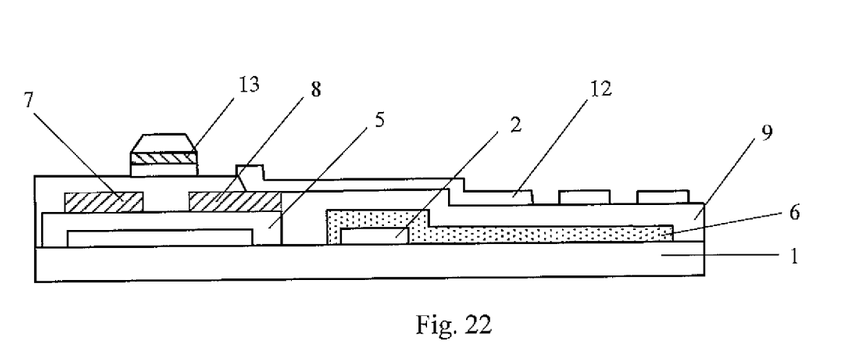

Step S21: removing the exposed gate metal layer 11, so as to obtain a pattern of the pixel electrode 12 and the gate electrode 13 of the thin film transistor, as shown in FIG. 22.

Step S22: removing the remaining fourth photoresist layer, so as to form the array substrate, as shown in FIG. 23.

The metal oxide layer may be made of IGZO or ITZO. As shown in FIG. 23, the array substrate of the present disclosure includes the base substrate 1, the light shielding layer C and the common electrode leading wire 2 arranged above the base substrate 1, the active layer 5 covering the light shielding layer C, and the common electrode 6 electrically connected to the common electrode leading wire 2. The active layer 5 and the common electrode 6 are formed by an identical metal oxide layer. The metal oxide layer of the active layer 5 has semiconductor properties, while the metal oxide layer of the common electrode 6 is subjected to plasma treatment and thus has electrical conducting properties. The source electrode 7 and the drain electrode 8 are arranged above the active layer 5. The source electrode 7, the drain electrode 8 and the active layer 5 are insulated from the gate electrode 13 by means of the insulating layer 9 thereabove, so as to form the thin film transistor. The pixel electrode 12 is arranged between the gate electrode 13 and the insulating layer 9 below the gate electrode 13, and the insulating layer 9 covers the base substrate 1, the source electrode 7, the drain electrode 8, the active layer 5 and the common electrode 6, with a portion of the drain electrode 8 being exposed. The exposed portion of the drain electrode 8 is located at a side adjacent to the common electrode 6, and an upper surface of the exposed drain electrode 8 is flush with an upper surface of the insulating layer 9 at the pixel region. The pixel electrode 12 is arranged on the insulating layer 9, and electrically connected to the drain electrode 8.

The method mentioned above uses a top-gate process, and as a result, it is able to significantly reduce the steps for manufacturing the array substrate, thereby to reduce the production cost thereof.

Figure 24:
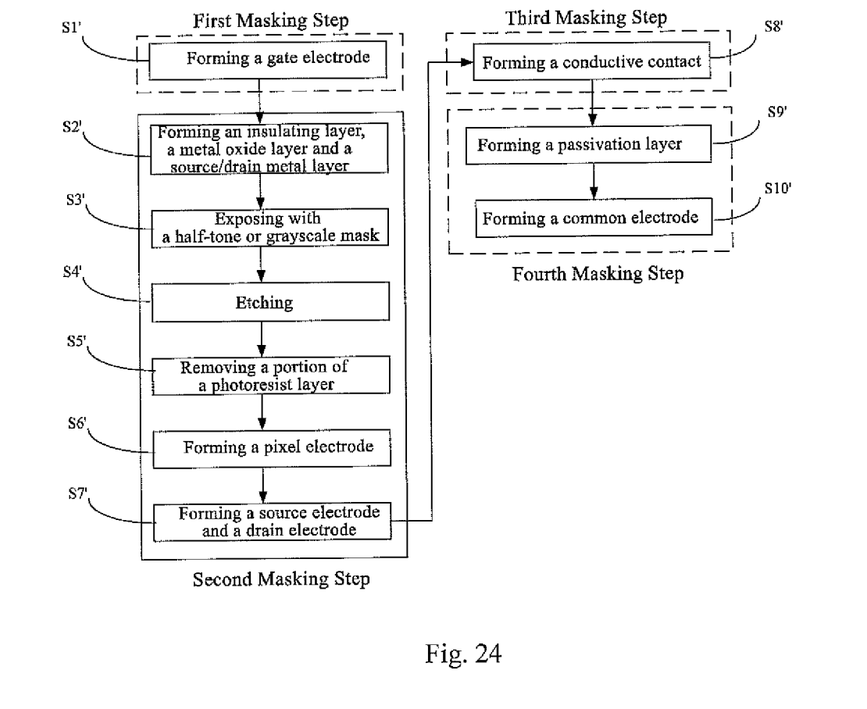
FIG. 24 is a flow chart of the method for manufacturing the array substrate according to another embodiment of the present disclosure.

Based on the above, the present disclosure provides in another embodiment a method for manufacturing the array substrate with a bottom-gate process, which also can reduce the steps for manufacturing the existing array substrate. FIG. 24 is a flow chart of the method for manufacturing the array substrate according to the other embodiment. This method will be described hereinafter in conjunction with FIGS. 25-34.

Figure 25:
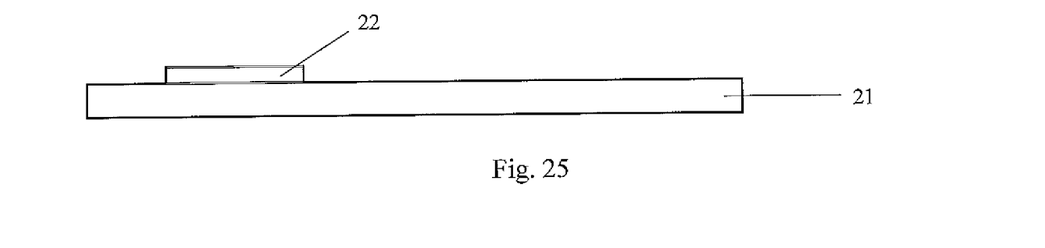

Step S1': forming a gate electrode 22 on a base substrate 21 by a first masking step, as shown in FIG. 25. This step is similar to the above Steps S1 to S3, and thus will not be repeated herein.

Figure 26:
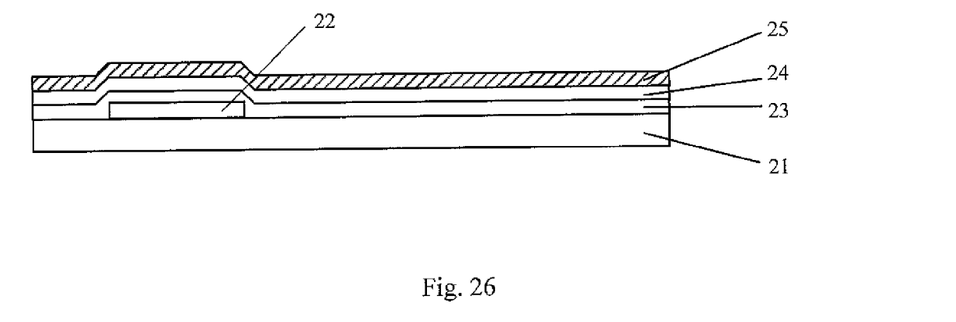

Step S2': forming an insulating layer 23, a metal oxide layer 24 and a source/drain metal layer 25 on the base substrate 21 sequentially, as shown in FIG. 26.

Figure 27:
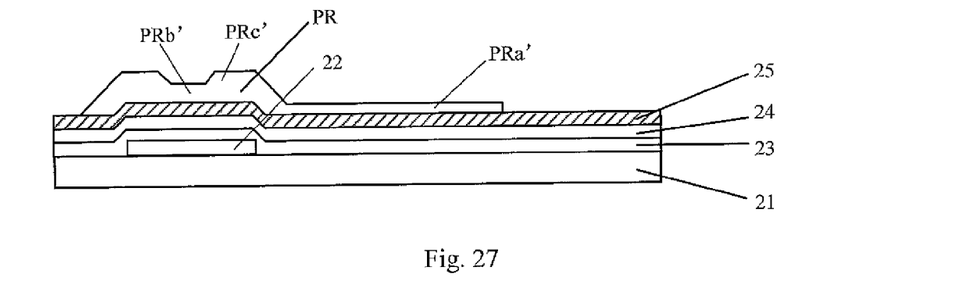

Step S3': applying a photoresist layer onto the source/drain metal layer 25, and exposing the photoresist layer with a mask. The to-be-formed pixel electrode corresponds to a first semi-transparent region PRa' of the mask, the channel of the to-be-formed thin film transistor corresponds to a second semi-transparent region PRb' of the mask, and the source electrode and the drain electrode of the to-be-formed thin film transistor correspond to a non-transparent region PRc' of the mask. The first semi-transparent region of the mask is of transmittance greater than that of the second semi-transparent region. The mask may be a half-tone or graytone mask. FIG. 27 shows the photoresist layer after the exposure and development with the mask. A region of the photoresist layer where the pixel electrode is to be formed, i.e., PRa', is of a first thickness t1', a region where the channel of the thin film transistor is to be formed, i.e., PRb', is of a second thickness t2', and a region where the source electrode and the drain electrode are to be formed, i.e., PRc', is of a third thickness t3'. The first thickness is less than the second thickness, and the second thickness is less than the third thickness. Alternatively, the first thickness is 2000 to 6000 Å, the second thickness is 6000 to 10000 Å, and the third thickness is 20000 to 30000 Å.

Figure 28:
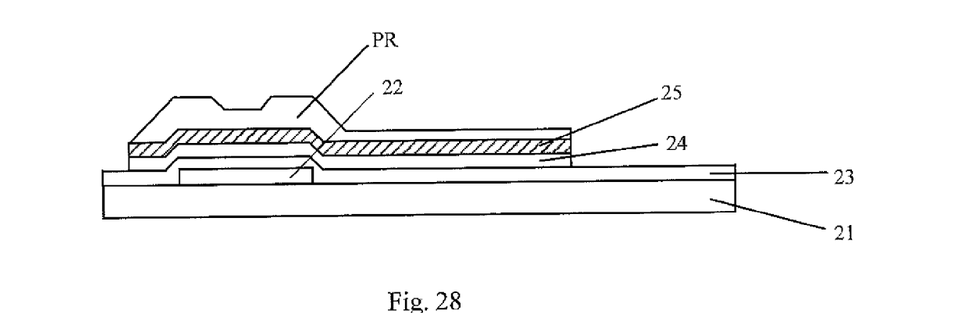

Step S4': etching a region not covered with the photoresist layer so as to remove the exposed source/drain metal layer 25 and metal oxide layer 24, without etching the insulating layer 23. FIG. 28 shows the structure after the etching.

Figure 29:
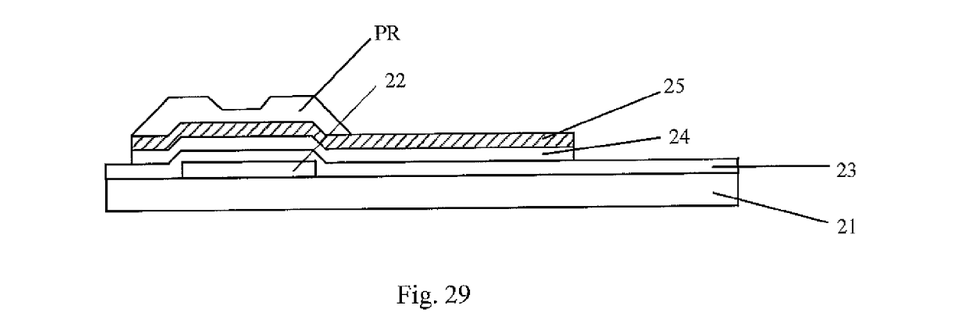

Step S5': removing a portion with a thickness equivalent to the first thickness from the entire photoresist layer by ashing, etc., so as to expose the region where the pixel electrode is to be formed, as shown in FIG. 29.

Figure 30:
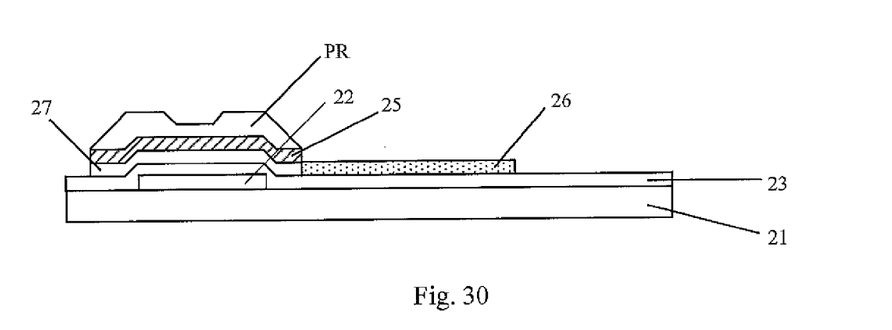

Step S6': removing the exposed source/drain metal layer 25 by etching so as to expose the metal oxide layer 24 therebelow, and subjecting the exposed metal oxide layer 24 to plasma treatment so as to enable the exposed metal oxide layer 24 to have electrical conducting properties, thereby to form a pixel electrode 26 with the exposed metal oxide layer. The metal oxide layer not subjected to the plasma treatment still maintains its semiconductor properties, and serves as an active layer 27, as shown in FIG. 30. Here, the steps of forming the pixel electrode 26 and the active layer 27 are similar to the above Steps S8 and S9, and thus will not be repeated herein.

Figure 31:
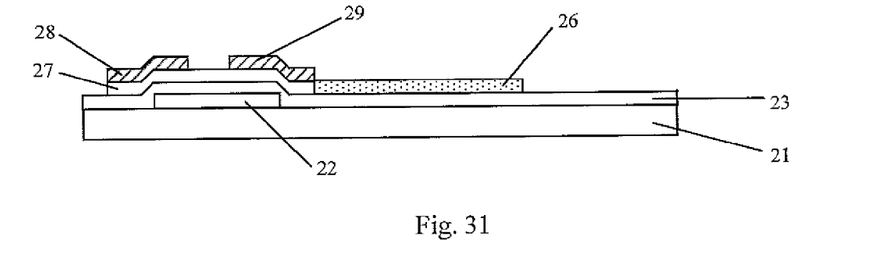

Step S7': removing a portion with a thickness obtained by subtracting the first thickness from the second thickness from the entire photoresist layer by ashing, etc. After the ashing, the photoresist layer with the second thickness is fully removed, so as to expose the region where the channel of the thin film transistor is to be formed. The exposed source/drain metal layer 25 is etched until the active layer 27 therebelow is reached, so as to form a source electrode 28 and a drain electrode 29 of the thin film transistor. The remaining photoresist layer is removed after the etching, thereby the second masking step is completed, as shown in FIG. 31. Here, this step is similar to the above Steps S10 to S12.

Figure 32:
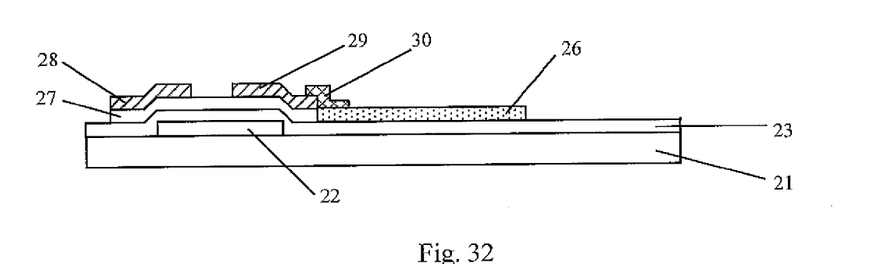

Step S8': forming a conductive contact 30 between the drain electrode 29 and the pixel electrode 26 by the third masking step, as shown in FIG. 32.

Figure 33:
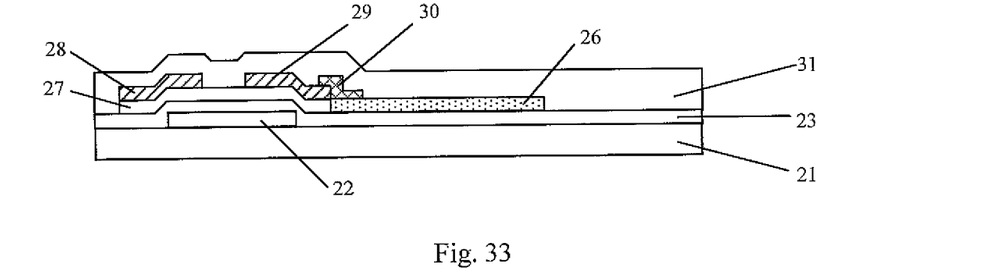

Step S9': depositing a passivation layer 31 onto the base substrate 21 by the fourth masking step, so as to cover the entire base substrate 21, as shown in FIG. 33.

Figure 34:
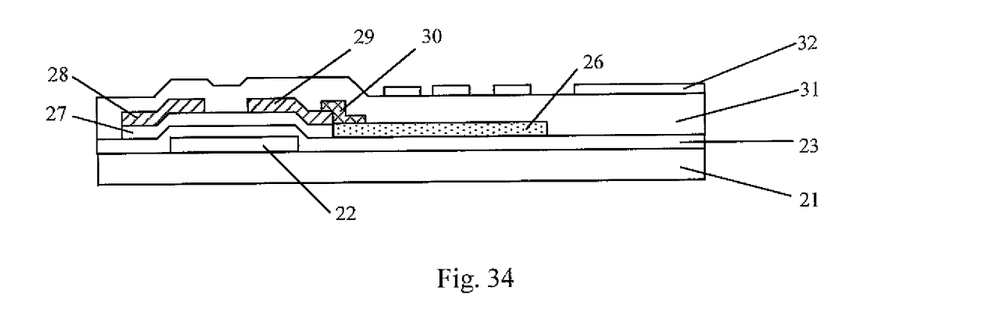

Step S10': forming a slit common electrode 32 on the passivation layer 31, as shown in FIG. 34.

As mentioned above, the array substrate with a bottom-gate structure is manufactured by four masking steps. As shown in FIG. 34, the array substrate with the bottom-gate structure includes the base substrate 21, the gate electrode 22 arranged above the base substrate 21, and the insulating layer covering the gate electrode 22; the active layer 27 and the pixel electrode 26 arranged above the insulating layer 23 and at an identical layer. The pixel electrode 26 and the active layer 27 are formed by an identical metal oxide layer and adjoin each other. The metal oxide layer of the active layer 27 has semiconductor properties, while the metal oxide layer of the pixel electrode 26 is subjected to the plasma treatment and thus has conductor properties. The metal oxide layer may be made of IGZO or ITZO. The source electrodes 28 and the drain electrodes 29 are arranged above the active layer 27, so as to form the thin film transistor. The drain electrode 29 is in electrical contact with the pixel electrode 26 via the conductive contact 30. The passivation layer 31 covers the insulating layer 23, the source electrode 28, the drain electrode 29, the active layer 27 and the pixel electrode 26, and the common electrode 32 is arranged on the passivation layer 31.

Through the method for manufacturing the array substrate with the top-gate or bottom-gate structure as mentioned above, it is able to significantly reduce the steps desired for manufacturing the array substrate, thereby to reduce the production cost thereof.

The above are merely the preferred embodiments of the present disclosure. It should be appreciated that, a person skilled in the art shall make further modifications and improvements without departing from the principle of the present disclosure, and these modifications and improvements shall also fall within the scope of the present disclosure.

What is claimed is:

1. A method for manufacturing an array substrate, comprising:
   providing a base substrate;
   depositing a metal oxide layer and a source and drain metal layer on the base substrate sequentially;
   coating a photoresist layer onto the source and drain metal layer, and exposing and developing the photoresist layer through a first semi-transparent region, a second semi-transparent region and a non-transparent region of a mask, to form a first region, a second region and a third region of the photoresist layer respectively; and
   etching a region of the source and drain metal layer which is not covered by the photoresist layer and a region of the metal oxide layer under the region of the source and drain metal layer, to form an active layer of a thin film transistor and a region of a first transparent electrode at the metal oxide layer, and form a region of a source electrode and a drain electrode of the thin film transistor and a region of a channel of the thin film transistor at the source and drain metal layer;
   wherein the region of the source electrode and the drain electrode of the thin film transistor and the region of the channel of the thin film transistor at the source and drain metal layer are arranged on the active layer;
   the first region, the second region and the third region of the photoresist layer cover respectively the region of the first transparent electrode at the metal oxide layer, the region of the channel of the thin film transistor at the source and drain metal layer, and the region of the source electrode and the drain electrode of the thin film transistor at the source and drain metal layer; and
   the first semi-transparent region of the mask is of transmittance greater than that of the second semi-transparent region of the mask.

2. The method according to claim 1, wherein subsequent to coating a photoresist layer onto the source and drain metal layer, and exposing and developing the photoresist layer through a first semi-transparent region, a second semi-transparent region and a non-transparent region of a mask, to form a first region, a second region and a third region of the photoresist layer respectively, the first region of the photoresist layer is of a first thickness, the second region of the photoresist layer is of a second thickness, and the third region of the photoresist layer is of a third thickness;
   the first thickness is smaller than the second thickness, and the second thickness is smaller than the third thickness.

3. The method according to claim 1, wherein the first and the second semi-transparent regions of the mask are half-tone or graytone masks.

4. The method according to claim 1, further comprising:
   processing the region of the first transparent electrode at the metal oxide layer by a plasma treatment, to form the first transparent electrode.

5. The method according to claim 1, wherein the metal oxide is IGZO, or ITZO, or a mixture thereof.

6. The method according to claim 1, wherein prior to depositing a metal oxide layer and a source and drain metal layer on the base substrate sequentially, the method further comprises:

forming a light shielding layer and a leading wire of the first transparent electrode on the base substrate, wherein the active layer of the thin film transistor covers the light shielding layer, and the first transparent electrode is a common electrode.

7. The method according to claim 6, wherein subsequent to etching a region of the source and drain metal layer which is not covered by the photoresist layer and a region of the metal oxide layer under the region of the source and drain metal layer, to form an active layer of a thin film transistor and a region of a first transparent electrode at the metal oxide layer, and form a region of a source electrode and a drain electrode of the thin film transistor and a region of a channel of the thin film transistor at the source and drain metal layer, the method further comprises:

ashing the first region, the second region and the third region of the photoresist layer, to expose the source and drain metal layer covering the region of the first transparent electrode at the metal oxide layer, and removing the source and drain metal layer covering the region of the first transparent electrode at the metal oxide layer by etching, to expose the region of the first transparent electrode at the metal oxide layer;

Processing, by a plasma treatment, the region of the first transparent electrode at the metal oxide layer which is exposed, to form the first transparent electrode;

ashing the second region and the third region of the photoresist layer, to expose the region of the channel of the thin film transistor at the source and drain metal layer;

removing, by etching, the source and drain metal layer which is not covered by the photoresist layer, to form the source electrode, the drain electrode and the channel of the thin film transistor;

forming an insulating layer covering the source electrode, the drain electrode, the channel of the thin film transistor and the first transparent electrode and provided with a via-hole, and forming a gate electrode of the thin film transistor and a second transparent electrode, wherein the second transparent electrode is a slit pixel electrode and electrically connected to the drain electrode through the via-hole in the insulating layer.

8. The method according to claim 7, wherein an upper surface of the drain electrode is flush with an upper surface of the insulating layer adjacent to the first transparent electrode.

9. The method according to claim 1, wherein prior to depositing a metal oxide layer and a source and drain metal layer on the base substrate sequentially, the method further comprises:

forming an insulating layer and a gate electrode of the thin film transistor on the base substrate.

10. The method according to claim 9, wherein subsequent to etching a region of the source and drain metal layer which is not covered by the photoresist layer and a region of the metal oxide layer under the region of the source and drain metal layer, to form an active layer of a thin film transistor and a region of a first transparent electrode at the metal oxide layer, and form a region of a source electrode and a drain electrode of the thin film transistor and a region of a channel of the thin film transistor at the source and drain metal layer, the method further comprises:

ashing the first region, the second region and the third region of the photoresist layer, to expose the source and drain metal layer covering the region of the first transparent electrode at the metal oxide layer, and removing the source and drain metal layer covering the region of the first transparent electrode at the metal oxide layer by etching, to expose the region of the first transparent electrode at the metal oxide layer;

processing, by a plasma treatment, the region of the first transparent electrode at the metal oxide layer which is exposed, to form the first transparent electrode;

ashing the second region and the third region of the photoresist layer, to expose the region of the channel of the thin film transistor at the source and drain metal layer;

removing, by etching, the source and drain metal layer which is not covered by the photoresist layer, to form the source electrode, the drain electrode, and the channel of the thin film transistor;

forming a conductive contact connecting the drain electrode and the first transparent electrode, the first transparent electrode being a pixel electrode; and forming a passivation layer and the second transparent electrode above the conductive contact, the second transparent electrode being a slit common electrode.

* * * * *